United States Patent
Choi et al.

(10) Patent No.: US 10,684,544 B2
(45) Date of Patent: Jun. 16, 2020

(54) OPTICAL PROXIMITY CORRECTION (OPC) METHOD AND METHOD OF MANUFACTURING MASK BY USING THE OPC METHOD

(71) Applicant: Samsung Electronics Co., Ltd., Suwon-si, Gyeonggi-do (KR)

(72) Inventors: Da-woon Choi, Hwaseong-si (KR); Yu-kyung Kim, Suwon-si (KR); Yun-kyoung Song, Hwaseong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 4 days.

(21) Appl. No.: 16/027,644

(22) Filed: Jul. 5, 2018

(65) Prior Publication Data
US 2019/0187552 A1   Jun. 20, 2019

(30) Foreign Application Priority Data
Dec. 18, 2017 (KR) .................. 10-2017-0174360

(51) Int. Cl.
| | | |
|---|---|---|
| G03F 1/30 | (2012.01) | |
| G03F 1/00 | (2012.01) | |
| G03F 7/20 | (2006.01) | |
| G03F 1/36 | (2012.01) | |

(52) U.S. Cl.
CPC ............... *G03F 1/36* (2013.01); *G03F 1/144* (2013.01); *G03F 7/705* (2013.01); *G03F 7/70441* (2013.01); *G03F 7/70508* (2013.01)

(58) Field of Classification Search
CPC ........ G03F 1/36; G03F 7/70441; G03F 7/705; G03F 1/144; G03F 7/70508; G03F 7/70433; G03F 1/00; G03F 1/20; G06F 17/5081
See application file for complete search history.

(56) References Cited

U.S. PATENT DOCUMENTS

| | | | |
|---|---|---|---|
| 7,360,199 B2 | 4/2008 | Scaman | |
| 7,707,541 B2 | 4/2010 | Abrams et al. | |
| 8,191,017 B2 | 5/2012 | Lipincott et al. | |
| 8,527,916 B1 | 9/2013 | Chiang et al. | |
| 9,355,204 B2 | 5/2016 | Seo et al. | |
| 9,390,217 B2 | 7/2016 | Wang et al. | |
| 9,558,947 B2 | 1/2017 | Wallace et al. | |
| 9,672,320 B2 | 6/2017 | Chang et al. | |
| 9,679,100 B2 | 6/2017 | Cheng et al. | |
| 2017/0097571 A1* | 4/2017 | Martin | H01J 37/3178 |
| 2017/0109459 A1* | 4/2017 | Lippincott | G06F 17/5009 |
| 2017/0270235 A1 | 9/2017 | Word et al. | |
| 2019/0155143 A1* | 5/2019 | Lippincott | G03F 1/36 |

FOREIGN PATENT DOCUMENTS

| | | |
|---|---|---|
| KR | 10-0951744 B1 | 3/2010 |
| KR | 10-2015-0024500 A | 3/2015 |

* cited by examiner

*Primary Examiner* — Vuthe Siek
(74) *Attorney, Agent, or Firm* — Lee IP Law, P.C.

(57) ABSTRACT

An optical proximity correction (OPC) whereby corner rounding may be effectively controlled, and a mask manufacturing method performed using the OPC method are provided. According to the OPC method, an inner edge is generated through decomposition of a layout, and a displacement (DISin_frag) of an inner fragment and a displacement (DISsel) of a selected fragment are calculated based on the inner edge to additionally displace a fragment, so as to manufacture a mask layout with minimized corner rounding without violating mask rule check (MRC).

20 Claims, 11 Drawing Sheets

OPTICAL PROXIMITY CORRECTION (OPC) METHOD AND METHOD OF MANUFACTURING MASK BY USING THE OPC METHOD

CROSS-REFERENCE TO RELATED APPLICATION

Korean Patent Application No. 10-2017-0174360, filed on Dec. 18, 2017, and entitled, "Optical Proximity Correction (OPC) Method and Method of Manufacturing Mask By Using the OPC Method," is incorporated by reference herein in its entirety.

BACKGROUND

1. Field

One or more embodiments herein relate to an optical proximity correction (OPC) method and a method for manufacturing as mask using an OPC method.

2. Description of the Related Art

One type of semiconductor process, known as a photolithography process, uses a mask to form a pattern on a semiconductor substrate such as a wafer. The mask may be a pattern transfer object, formed of an opaque material on a transparent base layer material, having a pattern shape. In a mask manufacturing operation, first, a circuit is designed and, then, a layout of the circuit is designed. Then, design data acquired by OPC is transmitted as mask tape-out (MTO) design data. Next, mask data preparation (MDP) is performed based on the MTO design data. Then, a front end of line (FEOL) process (such as an exposure process) and back end of line (BEOL) process (such as defect inspection) may be performed to complete manufacture of the mask.

SUMMARY

In accordance with one or more embodiments, an optical proximity correction (OPC) method may include dividing an edge of a layout of a target pattern into fragments, extracting a contour of the target pattern through simulation by inputting mask data including the fragments to an OPC model, calculating a difference between the contour and an edge of the target pattern as an edge placement error (EPE) of each of the fragments, and determining whether to perform extracting a contour of the target pattern. When extracting the contour of the target pattern is to be performed, determining a displacement of the fragments by multiplying the EPE by a feedback factor, and displacing the fragments by the displacement, wherein the OPC method proceeds to extracting the contour of the target pattern using displaced fragments. Dividing the edge of the layout of the target pattern into fragments includes decomposing the layout of the target pattern to form an inner edge, and the edge of the layout includes an outer edge before decomposing the layout and the inner edge, and the fragments include an outer fragment for the outer edge and an inner fragment for the inner edge.

In accordance with one or more embodiments, an optical proximity correction (OPC) method may include decomposing a layout of a target pattern including a corner, dividing an inner edge of the layout obtained by decomposing and an outer edge of the layout prior to decomposing, into fragments, extracting a contour of the target pattern through simulation by inputting mask data including the fragments, to an OPC model, calculating a difference between the contour and an edge of the target pattern as an edge placement error (EPE) of each of the fragments, determining a displacement of the fragments by multiplying the EPE by a set feedback factor, and displacing the fragments by the displacement. Extracting the contour of the target pattern includes using the mask data including the fragments displaced by mask rule check (MRC) in a simulation based on a first OPC model. When the EPE is greater than a set reference value or a number of times of performing simulation according to the OPC model does not equal a set reference number of times, proceeding to extracting the contour of the target pattern using displaced fragments.

In accordance with one or more embodiments a mask manufacturing method may include decomposing a layout of a target pattern including a corner, dividing an inner edge of the layout obtained by decomposing and an outer edge of the layout prior to decomposing, into fragments, extracting a contour of the target pattern through simulation by inputting mask data including the fragments to an optical proximity correction (OPC) model, calculating a difference between the contour and an edge of the target pattern for each of the fragments as an edge placement error (EPE), determining whether the EPE is equal to or less than a set reference value, or a number of times of performing simulation according to the OPC model equals a set reference number of times, determining final mask data when the EPE is equal to or less than a set reference value or the number of times of performing simulation according to the OPC model equals the set reference number of times, transferring the final mask data as mask tape-out (MTO) design data, preparing mask data based on the MTO design data, and performing exposure on a substrate for a mask, based on the mask data. When the EPE is greater than the reference value or the number of times of performing simulation according to the OPC model does not equal the reference number of times, the OPC method further includes determining a displacement of the fragments by multiplying the EPE by a set feedback factor; displacing the fragment by the displacement, and proceeding to extracting the contour of the target pattern based on displace fragments.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
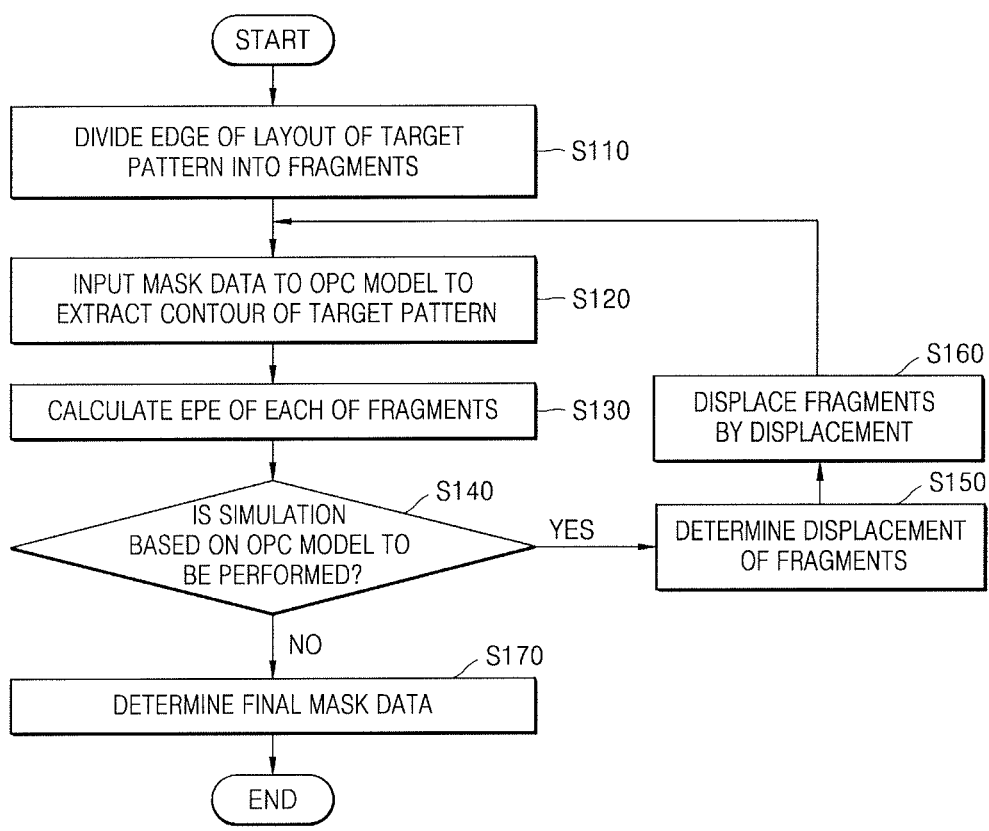
FIG. 1A illustrates an embodiment of an optical proximity correction (OPC) method.
Figure 1B:
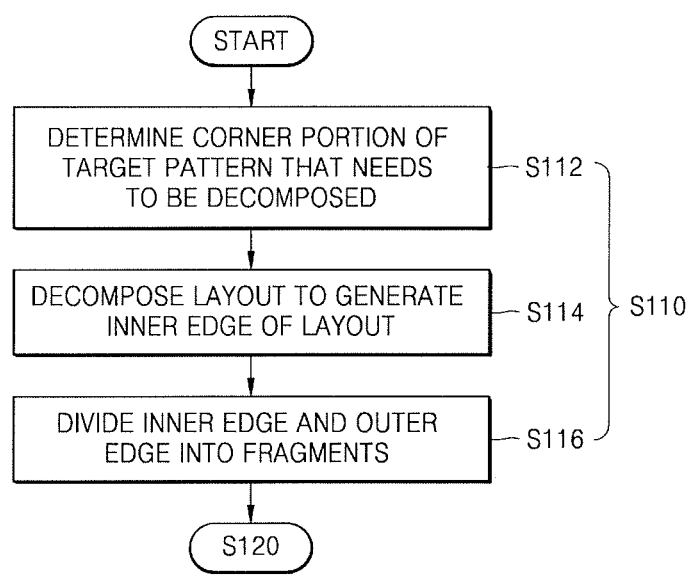
FIG. 1B illustrates an embodiment of an operation for dividing an edge of a layout into fragments in the method of FIG. 1A.

FIG. 1A illustrates an embodiment of an optical proximity correction (OPC) method, and FIG. 1B an embodiment of an operation of the method of FIG. 1A.

Referring to FIGS. 1A and 1B, the method including dividing an edge of a layout corresponding to a target pattern into fragments (S110). The target pattern may be, e.g., a pattern to be formed on a substrate (e.g., a wafer) through an exposure process using a mask. The layout may be, for example, the layout of a mask pattern to be formed on the mask. Thus, the mask pattern may be transferred to the substrate during the exposure process to form a target pattern on the substrate. Due to characteristics of the exposure process, the target pattern and a layout of the mask pattern may have different forms.

Additionally, a fragment may include, e.g., a straight line segment corresponding to an edge of a layout or data associated with the line segment. An edge of the layout may be divided into a plurality of fragments according to a predetermined dividing rule. A fragment length and/or the dividing rule may be set, e.g., by a user who performs an OPC method.

The OPC method refers to a method for reducing optical proximity effects (OPE) which occur during an exposure process as fine patterns affect one another. The optical proximity effects may be reduced by correcting a layout of the patterns. The OPC method may be classified into two types, a rule-based OPC method and a simulation-based or model-based OPC method. In one embodiment, the OPC method may be, e.g., a model-based OPC method which just uses measurement results of representative patterns without having to measure all of test patterns. Such a method may, therefore, be advantageous in terms of time and costs.

In one embodiment of the OPC method, operation S110 of dividing an edge of a layout into fragments may include decomposing the layout to generate an inner edge of the layout. Operation S110 of dividing an edge of a layout into fragments will be described in more detail with reference to FIG. 1B.

First, a corner portion of a target pattern that is to be decomposed is determined (S112). For example, a bent portion of an L-shaped pattern of FIG. 2A may be a corner portion of a pattern that is to be decomposed. In addition, a bent portion of a pattern where vertex portions of two squares overlap (hereinafter referred to as a 'kissing pattern') may be a corner portion of a pattern that is to be decomposed. However, the corner portion of the pattern that is to be decomposed is not limited to the bent portions of the pattern illustrated in FIGS. 2A and 2B.

Next, the layout is decomposed to generate an inner edge of the layout (S114). Decomposition of the layout may refer to decomposition of a portion of the layout corresponding to the corner portion of the target pattern. Through the decomposition of the layout, a new edge (e.g., an inner edge) may be generated. Decomposition of the layout will be described in further detail with reference to FIGS. 3A and 3B.

Next, the inner edge and an outer edge of the layout are divided into fragments (S116). The outer edge may refer to an edge of the layout before decomposition of the layout. The outer edge may be maintained without being affected by decomposition of the layout. In addition, the outer edge may be used as data for decomposition of the layout. The fragments may include a fragment relating to an inner edge (e.g., an inner fragment) and a fragment relating to an outer edge (e.g., an outer fragment).

After dividing the edge of the layout into fragments, mask data is input to an OPC model to extract a contour of the target pattern through simulation (S120). The OPC model is a simulation model used to extract a contour of the target pattern. Various types of basic data may be input to the OPC model as input data. The basic data may include mask data about the fragments. In addition, the basic data may include information data of a photoresist into which the mask pattern is to be transferred, e.g., a thickness, a refractive index, or a dielectric constant of the photoresist, and data of an illumination system, e.g., a source map. The basic data may include different or additional data in another embodiment. The mask data may include not only data of the fragments, but also data regarding the patterns, e.g. the shape of patterns, locations of the patterns, measurement type of the patterns (measurement of spaces or lines), and basic measurement values.

The contour of the target pattern is a resultant product of a simulation based on the OPC model, and may correspond to a form of a pattern formed on a wafer in an exposure process using a mask. Accordingly, an aim of the OPC may be to create a contour that is as similar as possible as a form of the target pattern.

After extracting the contour of the target pattern, an edge placement error (EPE) of each fragment is calculated (S130). An EPE may be calculated based on Formula (1).

$$EPE = contour - target\ pattern \tag{1}$$

EPE is a difference between the contour and the edge of the target pattern. A large EPE indicates a large difference between the contour and the target pattern, e.g., that a layout of a mask is not suitable to form the target pattern. Accordingly, in order to implement a mask layout appropriate to form a target pattern, EPE may have to be reduced to a set reference value or less by modifying the mask layout.

EPE is calculated for each fragment. When a contour portion corresponds to a straight edge, an average of values (obtained by subtracting edges of the target pattern from contour portions respectively corresponding to fragments) may be calculated as an EPE. When a contour portion corresponds to a corner, a maximum value or a minimum value (among the values obtained by subtracting corner positions of the target pattern from the contour portion) may be calculated as an EPE. For example, a minimum value at a concave corner portion of a target pattern may be calculated as an EPE, and a maximum value at a convex corner portion of a target pattern may be calculated as an EPE. An operation for calculating an EPE will be described in more detail with reference to FIGS. 5A and 5B.

After calculating the EPE, a determination is made as to whether to perform simulation based on an OPC model (hereinafter referred to as 'OPC simulation') (S140). For example, whether to further perform OPC simulation may be determined depending on whether the calculated EPE exceeds a set reference value. When, for example, the calculated EPE exceeds a reference value, a determination is made to perform an OPC simulation. When the calculated EPE is equal to or less than a reference value, a determination is made not to perform an OPC simulation. Performing of OPC simulation may ultimately refer to the extracting a contour of a target pattern (S120).

According to another embodiment, a determination is made as to whether to further perform OPC simulation by comparing the number of times of performing OPC simulation with a set reference number of times. For example, when the number of times for performing OPC simulation is less than the reference number of times, a determination is made to perform OPC simulation. When the number of times of performing an OPC simulation corresponds to, i.e., equals, the reference number of times, a determination is made not to perform an OPC simulation. The reference number of times may be set based, e.g., based on an average number of times or a maximum number of times at which an EPE reaches a reference value through OPC simulation.

When it is determined to perform OPC simulation (Yes), displacement of a fragment is determined (S150). The displacement DIS of a fragment may be calculated based on Formula (2)

$$DIS = EPE*FB \quad (2)$$

FB indicates a feedback factor, which may be set, e.g., by a user performing an OPC method. In one embodiment, FB may be greater than −1 and less than 0. The numerical value of FB may be in a different range in another embodiment. Here, (−) and (+) may indicate directions in which a fragment is displaced. For example, displacement may correspond to a distance where a current location of a fragment is moved to the left or right or upwards or downwards, and may be less than the absolute value of EPE.

A fragment may include an outer fragment and an inner fragment as described above. Accordingly, the displacement of a fragment may include a displacement DISout_frag of an outer fragment and a displacement DISin_frag of an inner fragment. DISout_frag may be calculated based on Formula (2) above. For example, DISout_frag may be calculated from DISout_frag=EPEout_frag*FB, where EPEout_frag may indicate an EPE relating to an outer fragment.

Next, DISin_frag (an EPE relating to an inner fragment EPEin_frag) may be calculated based on Formula (3).

$$EPEin\_frag = 1/n * \Sigma EPEsel(i) \quad (3)$$

When a circle having a radius set with respect to an inner fragment is drawn, and an outer fragment having at least a portion included within the circle is referred to as a selected fragment (e.g., see description with reference to FIG. 6), EPEsel(i) may refer to an EPE about an i-th selected fragment. As the selected fragment belongs to the outer fragment, EPEsel(i) may be calculated based on Formula (1). In Formula (3), n indicates the number of selected fragments and i may be a natural number from 1 to n. Thus, in one embodiment, EPEin_frag may be an average of EPEs regarding selected fragments. Moreover, EPEin_frag of an inner fragment which has no selected fragment does not have to be calculated.

After calculating EPEin_frag. DISin_frag may be calculated based on Formula (4) and displacement DISsel of a selected fragment may be calculated based on Formula (5).

$$DISin\_frag = EPEin\_frag * FB * R \quad (4)$$

$$DISsel = EPEsel * FB * (1-R) \quad (5)$$

Here, R is a set weight factor, which, e.g., may be set by a user performing an OPC method. R may have, for example, a value equal to or greater than 0 and equal to or less than 1, e.g., $0 \leq R \leq 1$.

As DISsel indicates a displacement of a selected fragment belonging to an outer fragment. In one embodiment, DISsel may correspond to an additional displacement of DISout_frag that is already calculated. In addition, when no inner edge is generated through layout decomposition, DISin_frag and DISsel may not be calculated. Accordingly, DISin_frag and DISsel may correspond to a type of correction displacement. When R is 1, only DISin_frag may be calculated and DISsel may be 0. On the contrary, when R is 0, only DISsel may be calculated and DISin_frag may be 0. Thus, DISin_frag and DISsel may be appropriately controlled by adjusting R.

When a displacement of a fragment is determined, the fragment is displaced by the displacement (S160). Displacement of the fragment may correspond to displacement of the edge of the layout and, also, to a change in the mask layout.

Next, the method proceeds to operation S120 for extracting a contour of the target pattern to extract a contour of the target pattern through OPC simulation. In one embodiment, data of the fragment displaced by the calculated displacement may be input to the OPC model in advance as mask data.

When it is determined not to perform OPC simulation (No), final mask data is determined (S170). The final mask data may be mask data including data of a final fragment.

An EPE obtained through extraction of a contour of a target pattern through first OPC simulation and calculation of an EPE according to the extraction may greatly vary from a reference value. Accordingly, after performing OPC simulation several to several tens of times, it may be determined not to perform OPC simulation. As a result, mask data including data of a fragment that is displaced through a plurality of times of OPC simulation may be determined as final mask data.

The OPC method of the present embodiment may be regarded as modifying a layout of a mask so that a contour corresponds to a target pattern. This may be accomplished by reducing or minimizing an EPE through repeatedly performance of OPC simulation. For example, according to the OPC method of the present embodiment, an inner edge is generated through layout decomposition and DISin_frag and DISsel are calculated based on the inner edge to additionally displace a fragment. Thus, a mask layout may be implemented without violating mask rule check (MRC), while reducing or minimizing corner rounding. In addition, by manufacturing a mask based on the mask layout obtained using the OPC method according to the present embodiment, an excellent mask through which an optimum target pattern may be formed on a wafer may be implemented.

MRC may refer, e.g., to checking the limitations on a width of a pattern or the distance between patterns that is to be maintained. For example, when manufacturing a mask, various restrictions preventing a pattern width smaller than a set minimum width or the distance between patterns less than a set minimum distance. MRC may refer to a process for checking whether the restrictions over a mask layout are kept. On the other hand, corner rounding, which refers to rounding of a corner portion of a pattern during an exposure process due to resolution limits, may be the main cause that reduces a process margin.

The competing goals of adhering to the MRC and correcting corner rounding may be in a trade-off relationship. In other words, keeping the MRC and minimizing corner rounding may be difficult. For example, when an OPC method is performed to minimize corner rounding so as to obtain a mask layout that is as close as possible to a target pattern, the MRC may be violated. On the other hand, if an OPC method is performed without violating the MRC, corner rounding is increased, which may cause a mask layout to greatly deviate from a target pattern, thus causing defects in the OPC method.

The OPC method of the present embodiment may be performed by generating an inner edge through layout decomposition, and mapping the inner edge on an outer edge. The inner edge may increase a degree of freedom of a corner, thereby contributing to formation of a contour of a target pattern without corner distortion. Thus, according to the OPC method of the present embodiment, corner rounding may be effectively controlled without violating the MRC.

Figure 2A:
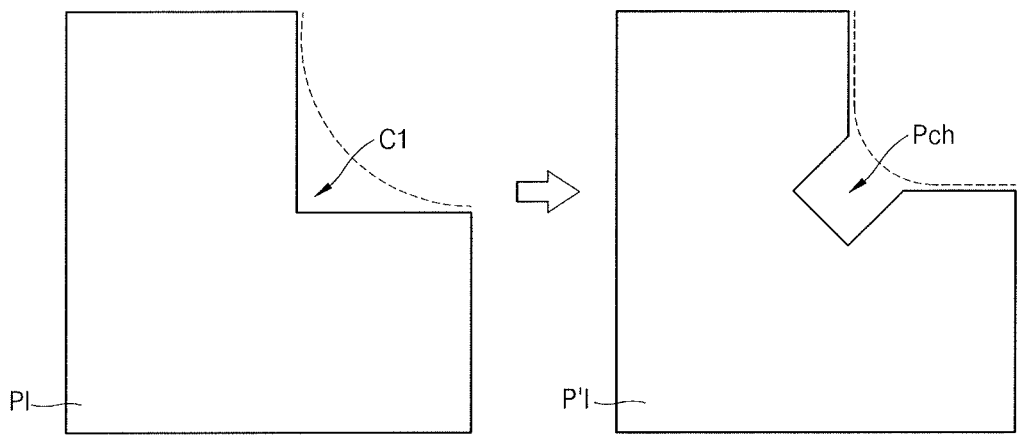
FIGS. 2A and 2B illustrate methods for reducing corner rounding.
Figure 2B:
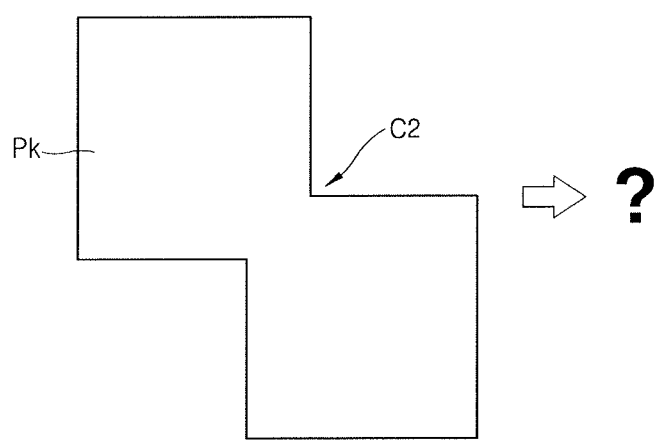

FIGS. 2A and 2B illustrate conceptual diagrams of a method for reducing corner rounding. Referring to FIG. 2A, an L-shaped pattern Pl includes a concave corner C1 and corner rounding (dotted line) that may occur in that corner portion C1. In order to reduce the corner rounding, a method for forming a diagonal pattern, for example, a chop pattern Pch, having an inserted form like an L-shaped pattern P'l illustrated on the right side may be considered. Similarly, a method for reducing corner rounding by forming a chop pattern having a protruding shape for a convex corner portion on the opposite side of the concave corner C1 may be considered. However, as the chop pattern has to be formed in a diagonal direction (e.g., in a direction at an angle of 45°) to the concave corner C1, forming the chop pattern on a mask in reality may be difficult.

Referring to FIG. 2B, as illustrated in FIG. 2B, the kissing pattern Pk may include two concave corners C2 on two sides. In the kissing pattern Pk, it may not be possible to form a chop pattern at the corners C2. Forming a chop pattern at the corners C2 may violate the MRC. As a result, for the kissing pattern Pk, a method for reducing corner rounding using a chop pattern is not even possible. Accordingly, a mask including the kissing pattern Pk may lead to defects in an OPC method or violation of the MRC.

According to one proposed OPC method, there is the restriction that one polygon should stay a polygon also after the OPC method. This restriction may be a limitation in regards to optimizing the OPC method. Here, a polygon corresponds to a layout of a mask, and may denote a polygon in which an edge line is connected as one line. The OPC method of the present embodiment is optimized by giving a higher degree of freedom to a polygon through layout decomposition, thereby generating a mask layout that is close to a target pattern.

Figure 3A:
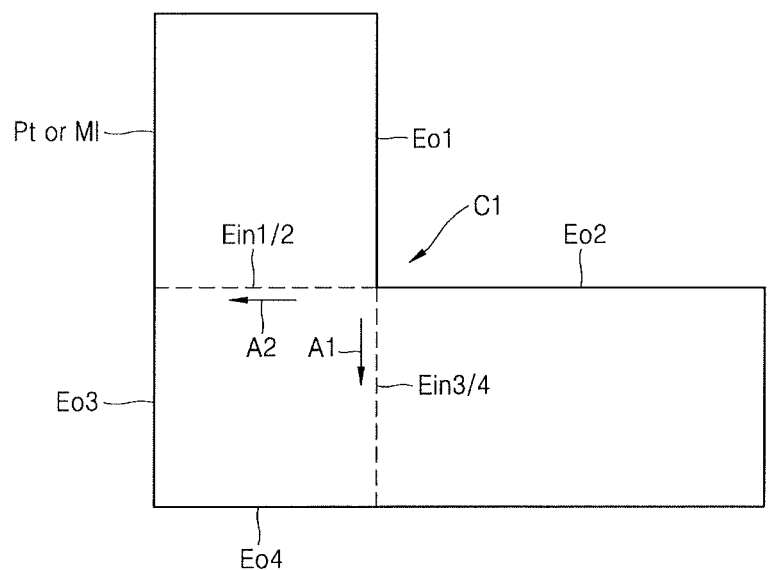
FIGS. 3A and 3B illustrate an embodiment of a process for decomposing a layout of an L-shaped target pattern in an OPC method.
Figure 3B:
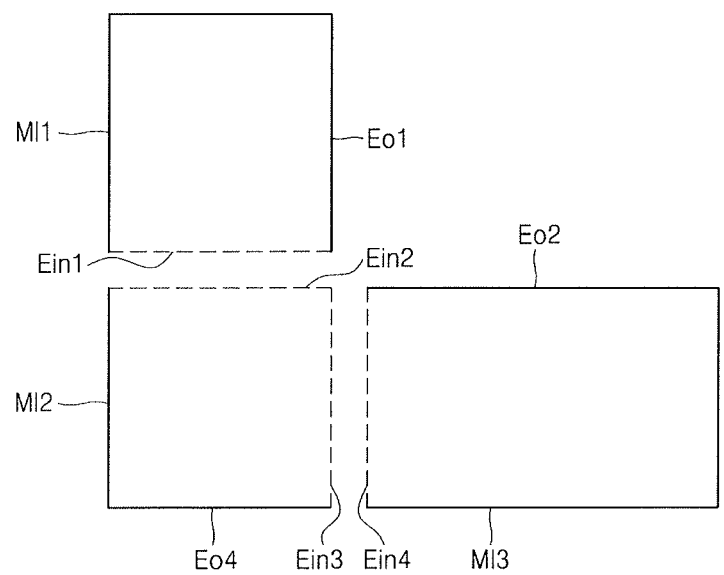

FIGS. 3A and 3B illustrate conceptual diagrams of a process for decomposing the layout of an L-shaped target pattern in an OPC method according to an embodiment. Referring to FIGS. 3A and 3B, a layout M1 about a target pattern Pt having an L-shape may include first through fourth outer edges Eo1 through Eo4. While an outer edge connecting the first outer edge Eo1 and the third outer edge Eo3, and an outer edge connecting the second outer edge Eo2 and the fourth outer edge Eo4 are present, these outer edges do not contribute to forming of an inner edge and, thus, are not marked.

A method for decomposing a layout M1 to form an inner edge may be performed as follows. First, the first outer edge Eo1 and the second outer edge Eo2 adjacent to the corner C1 are selected. Next, a line of the first outer edge Eo1 is extended into the layout Ml as shown by an arrow A1 indicating a downward direction, e.g. towards the fourth outer edge Eo4, so as to decompose the layout M1 along a dotted line meeting the fourth outer edge Eo4. In addition, a line of the second outer edge Eo2 is extended into the layout M1 as shown by an arrow A2 indicating a left direction, e.g., towards the third outer edge Eo3, so as to decompose the layout M1 along a dotted line meeting the third outer edge Eo3. Through this decomposition of the layout M1, four inner edges (that is, first through fourth Ein1 through Ein4) may be generated.

In FIG. 3A, the layout M1 is illustrated as a single unit without separate portions. Accordingly, two inner edges between the first outer edge Eo1 and the third outer edge Eo3 are marked by one first edge dotted line Ein1/2. Also, two inner edges between the second outer edge Eo2 and the fourth outer edge Eo4 are illustrated by one second edge dotted line Ein3/4.

As illustrated in FIG. 3B, the four inner edges Ein1 through Ein4 may be more distinct when separated portions M11 through M13 of the layout M1 are separated. Thus, the layout M1 may be decomposed into a first layout M11, a second layout M12, and a third layout M13 through decomposition of the layout M1. Accordingly, a first inner edge Ein1 may be formed in the first layout M11, a second inner edge Ein2 and a third inner edge Ein3 may be formed in the second layout M12, and a fourth inner edge Ein4 may be formed in the third layout M13. However, the first through third layouts M11 through Ml3 decomposed through decomposition of the layout M1 may not be immediately separated, but may be maintained in a combined structure as illustrated in FIG. 3A at first.

Figure 4:
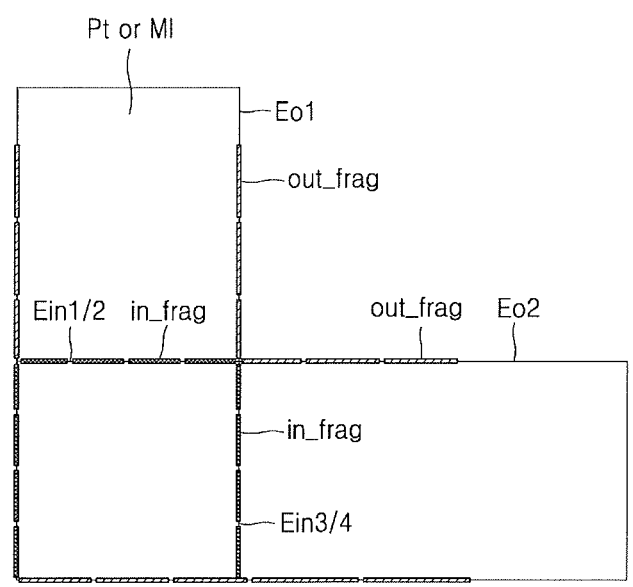
FIG. 4 illustrates an embodiment of a process for dividing an edge into fragments after layout decomposition in an OPC method.

FIG. 4 illustrates a conceptual diagram corresponding to a process for dividing an edge into fragments after layout decomposition in an OPC method according to an embodiment. Referring to FIG. 4, first, the first through fourth outer edges Eo1 through Eo4 are divided into outer fragments out_frag composed of straight lines. In addition, the first through fourth inner edges Ein1 through Ein4 are divided into inner fragments in_frag composed of straight lines.

The length of each of the outer fragments out_frag and the inner fragments in_frag and the dividing rule thereof may be set, e.g., by a user performing the OPC method. In an example, when the length of one outer fragment out_frag is set to 50 nm or longer and the first outer edge Eo1 is 220 nm, the first outer edge Eo1 may be divided into four outer fragments out_frag that are each 55 nm long. When the first outer edge Eo1 is 140 nm, the first outer edge Eo1 may be divided into two outer fragments out_frag that are each 70 nm long. Accordingly, when an outer edge is short, the number of outer fragments out_frag may be small and the length thereof may be long, and the degree of freedom of division and displacement of the outer fragments out_frag may decrease.

Meanwhile, in FIG. 4, while no outer fragments are marked in some of the outer edges, all outer edges may be divided into outer fragments. In addition, in FIG. 4, the first edge dotted line Ein1/2 is divided into inner fragments in_frag and the second edge dotted line Ein3/4 is divided into inner fragments in$_{13}$ frag. However, as shown in FIG. 3B, in reality, each of the first inner edge Ein1 and the second inner edge Ein2 may be divided into inner fragments in_frag. Also, each of the third inner edge Ein3 and the fourth inner edge Ein4 may be divided into inner fragments in_frag.

Figure 5A:
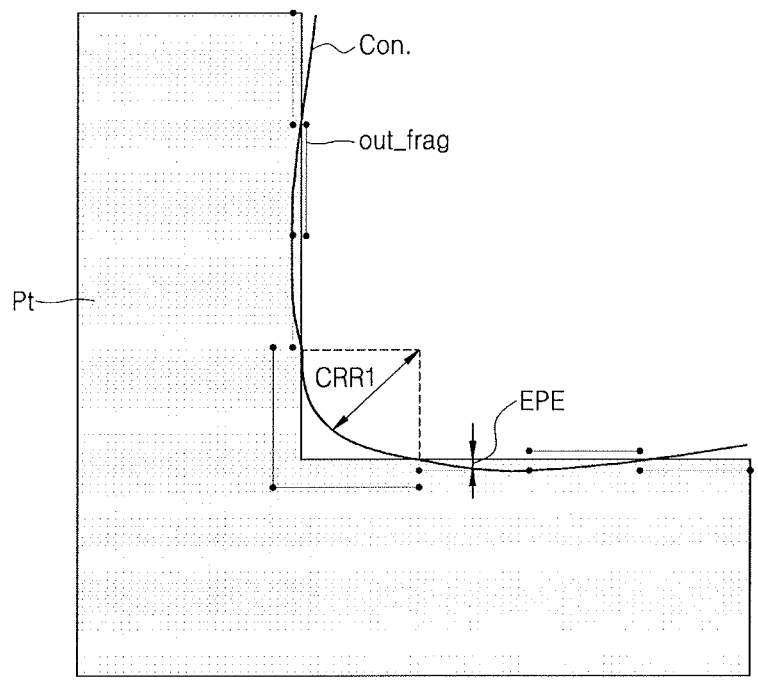
FIGS. 5A and 5B illustrate examples of an edge placement error (EPE) and a displacement of fragments.
Figure 5B:
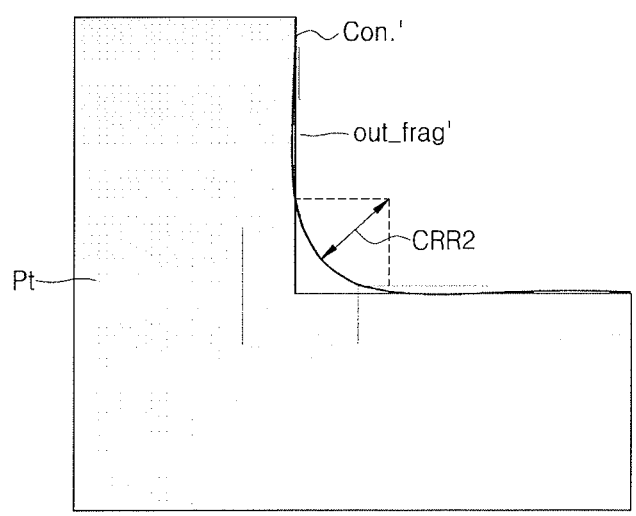

FIGS. 5A and 5B illustrate conceptual diagrams relating to an EPE and a displacement of fragments according to an embodiment. The outer fragments out_frag are illustrated as line segments, and a contour Con. is illustrated as a thick curve.

Referring to FIG. 5A, the outer fragment out_frag may be an outer fragment out_frag before initial OPC simulation is performed. In addition, the outer fragment out_frag may also be an outer fragment out_frag after OPC simulation is performed at least once. When the outer fragment is the outer fragment out_frag before initial OPC simulation is performed, the outer fragment out_frag may be the outer fragment out_frag that is displaced from a location corresponding to an outer edge of the layout as illustrated in FIG. 4 according to the MRC. When the outer fragment out_frag is the outer fragment out_frag after OPC simulation is performed at least once, the outer fragment out_frag may be the outer fragment out_frag that is displaced based on EPE calculation and by a fragment displacement according to the EPE calculation.

EPE may be defined by a difference between the contour Con. and an edge of a target pattern Pt as shown by two arrows from two sides. For example, EPE may be defined by Formula (1) above. When the contour Con. corresponds to a straight edge of the target pattern Pt, EPE may be calculated for each fragment. In addition, EPE may be calculated based on an average of EPEs calculated from points of the target pattern Pt corresponding to some of points set from each fragment.

When the contour Con. corresponds to a corner of the target pattern Pt, a minimum value of an absolute value (obtained by subtracting a corner location of the target pattern Pt from the contour Con.) may be calculated as an EPE. When the contour Con. is outside the target pattern Pt in a concave corner portion of the target pattern Pt, values obtained by subtracting a corner location from the contour Con. are positive (+) values. Accordingly, a minimum value among these values may be determined as an EPE. When, as the contour Con. is outside the target pattern Pt in a convex corner portion of the target pattern Pt, values obtained by subtracting a corner location from the contour Con. are negative (−) values. Accordingly, a maximum value among these values may be determined as an EPE. In other words, the largest absolute value of the difference between the contour Con. and a corner of the target pattern Pt is selected as an EPE.

When describing corner rounding, a corner rounding radius (CRR) may be typically defined. For example, CRR may correspond to the distance from a corner location to a point at which the contour Con. first meets the target pattern Pt. In FIG. 5A, a relatively large CRR CRR1 is illustrated. Thus, relatively large corner rounding may be generated by a mask layout corresponding to an outer fragment out_frag.

Referring to FIG. 5B, an outer fragment out_frag' is illustrated as a thin line and a contour Con.' is illustrated as a thick curve. The outer fragments out_frag' may be outer fragments out_frag' after performing final OPC simulation. Accordingly, the outer fragment out_frag' represents a layout of a final mask and may be included in data of the final mask. FIG. 5B illustrates a CRR CRR2 that is smaller than the CRR CRR1 of FIG. 5A. Accordingly, a mask layout corresponding to the outer fragment out_frag' (e.g., the layout of a final mask) may significantly reduce corner rounding.

Figure 6:
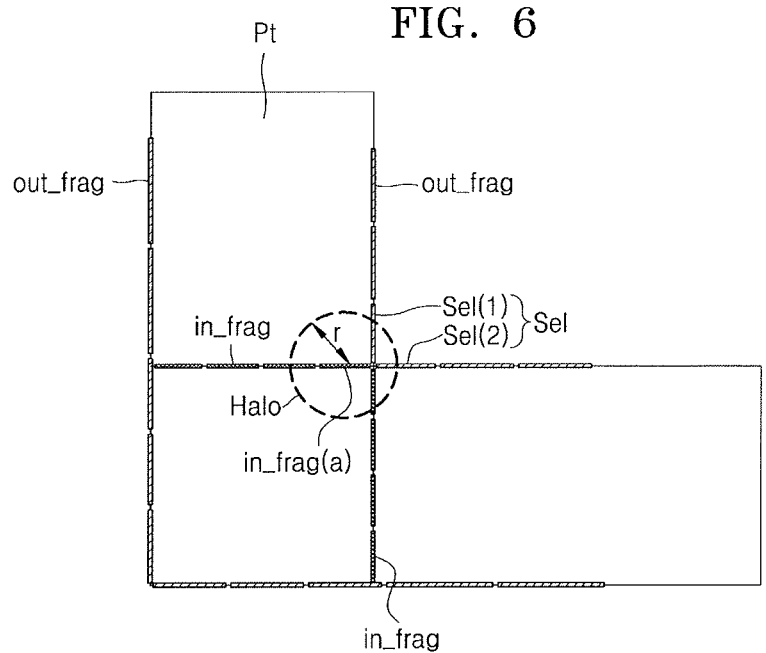
FIG. 6 illustrates an embodiment of a process for extracting a selected fragment to calculate an EPE of an inner fragment in an OPC method.

FIG. 6 illustrates a conceptual diagram corresponding to a process for extracting a selected fragment to calculate an EPE of an inner fragment in an OPC method according to an embodiment. Referring to FIG. 6, as described above, an EPE is calculated based on Formula (1), and whether to perform OPC simulation is determined according to predetermined determination standards.

When an OPC simulation is to be performed, EPEin_frag, which is an EPE of an inner fragment, may be calculated. For reference, whether to perform OPC simulation may be determined based on EPEout_frag, which is an EPE of an outer fragment, or the number of times of performing the simulation. However, EPEin_frag, the EPE of the inner fragment, is not directly related to a contour, and thus may not be used in determining whether to perform OPC simulation.

In order to calculate EPEin_frag, first, a selected fragment Sel relating to an inner fragment in_frag may be selected. For example, when a selected fragment Sel relating to a predetermined inner fragment in_frag is selected, first, a circle Halo having a radius (r) set with respect to a predetermined inner fragment in_frag is drawn, and an outer fragment out_frag having at least a portion included in the circle Halo may be selected as the selected fragment Sel. Selection of a selected fragment Sel may be performed on all inner fragments in_frag. If an inner fragment in_frag does not have a selected fragment Sel, subsequent processes after the selection of a selected fragment Sel may be omitted.

When a selected fragment Sel is selected, EPEin_frag may be calculated for each inner fragment in_frag based on Formula (3) above. In addition, displacement of the inner fragment in_frag, DISin_frag may be calculated based on Formula (4), and displacement of the selected fragment Sel, DISsel may be calculated based on Formula (5). For example, EPEin_frag of an inner fragment in_frag(a) of FIG. 6, adjacent to the corner portion, is calculated. Assuming FB=−0.4, Halo size=100 nm, and R=0.75, a first selected fragment Sel(1) and a second selected fragment Sel(2) come within the Halo size.

Assuming that EPEsel(1)=0.005 and EPEsel(2)=0.003, EPEin_frag(a) may be calculated as 0.004 according to Formula (3). As EPEsel(1) and EPEsel(2) correspond to an EPE of an outer fragment EPEout_frag, they may be calculated using Formula (1). In addition, according to Formula (4), DISin_frag(a)=0.004*(−0.4)*0.75=−0.0012. According to Formula (5), DISsel(1)=0.005*(−0.4)*(1−0.75)=−0.0005 and DISsel(2)=0.003*(−0.4)*(1−0.75)=−0.0003.

While inner fragments for the first inner edge Ein1 (see FIG. 3B) and inner fragments for the second inner edge Ein2 (e.g., see FIG. 3B) are marked as same inner fragments in FIG. 6, there are inner fragments in_frag of the first inner edge Ein1 and the second inner edge Ein2, respectively, as described above. Accordingly, selection of selected fragments Sel of the inner fragments in_frag of the first inner edge Ein1 and the second inner edge Ein2 may also be respectively performed.

Before selecting a selected fragment Sel of the inner fragments in_frag, the inner fragments in_frag may be displaced according to the MRC. For example, the inner fragment in_frag of the first inner edge Ein1 may be displaced toward the first layout Ml1 (e.g., see FIG. 3B) and the inner fragment in_frag of the second inner edge Ein2 may be displaced toward the second layout M12 (e.g., FIG. 3B), so that a distance satisfying the MRC between the inner fragment in_frag of the first inner edge Ein1 and the inner fragment in_frag of the second inner edge Ein2 are maintained. Accordingly, locations of the inner fragment in_frag of the first inner edge Ein1 and the inner fragment in_frag of the second inner edge Ein2 may not be the same as shown in FIG. 6, but may be different from each other.

Figure 7:
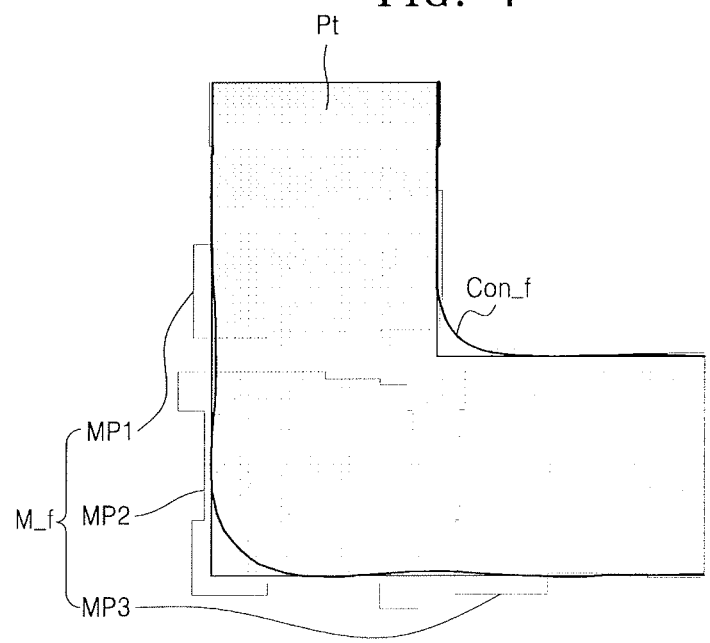
FIG. 7 illustrates an embodiment of a mask and a contour of an L-shaped target pattern finally obtained in an OPC method.

FIG. 7 illustrates a conceptual diagram of a mask and the contour of an L-shaped target pattern that may finally be obtained in an OPC method according to an embodiment.

Referring to FIG. 7, as described above, when an OPC simulation is to be performed, a selected fragment Sel regarding an inner fragment in_frag is selected and EPEin_frag is calculated using Formula (3). Next, DISin_frag is calculated using Formula (4) and DISsel is calculated using Formula (5). An outer fragment out_frag is displaced by a displacement DIS calculated using Formula (2) and the inner fragment in_frag is displaced by DISin_frag. In addition, the selected fragment Sel in the outer fragment out_frag is further displaced by DISsel. Next, the method proceeds to operation S120 for extracting a contour of the target pattern to perform OPC simulation and an EPE is calculated. Then, a determination of whether to perform OPS simulation is performed again.

By repeatedly performing this process, final mask data may be determined when an OPC simulation is stopped, either due to the calculated EPE being equal to or less than a set reference value or a set number of iterations has been met. Final mask data may be mask data including data of final fragments, and may correspond to a final layout M_f denoted by a thin line in FIG. 7. The final layout M_f may include first through third layouts MP1 through MP3 that are separated from each other in FIG. 7. A thick curve may correspond to a final contour Con_f. As corner rounding is reduced or minimized, the final contour Con_f may be very close to the target pattern Pt.

Figure 8A:
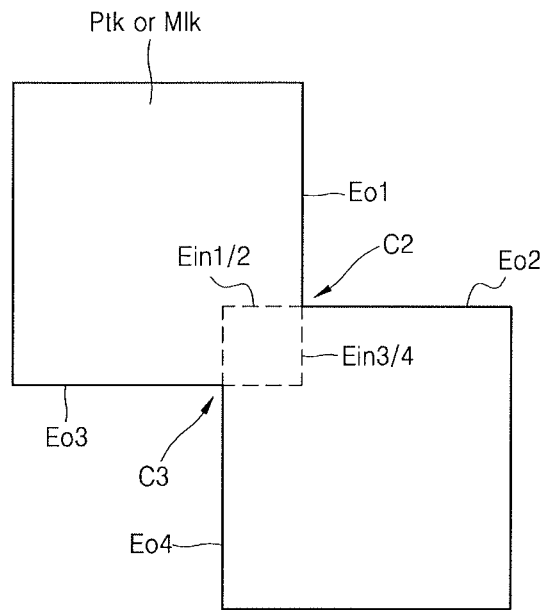
FIGS. 8A and 8B illustrate an embodiment of an operation for decomposing a layout of a target pattern having a kissing pattern shape.
Figure 8B:
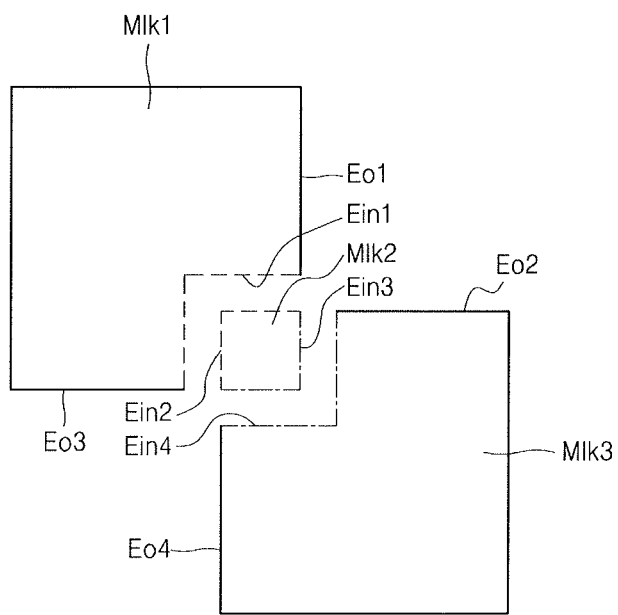

FIGS. 8A and 8B illustrate conceptual diagrams for an operation of decomposing a layout Mlk of a target pattern Ptk having a kissing pattern shape. Referring to FIGS. 8A and 8B, the layout Mlk of the target pattern Ptk having a kissing pattern shape may include first through fourth outer edges Eo1 through Eo4. Outer edges connecting the first outer edge Eo1 and the third outer edge Eo3 and outer edges connecting the second outer edge Eo2 and the fourth outer edge Eo4 do not contribute to formation of an inner edge, and thus are not marked.

A method for decomposing the layout Mlk to form an inner edge is performed as follows. First, the first outer edge Eo1 adjacent to an upper corner C2 and the third outer edge Eo3 adjacent to a lower corner C3 are selected. Next, a line of the first outer edge Eo1 is extended downwards into the layout Mlk, a line of the third outer edge Eo3 is extended to the right into the layout Mlk, and the layout Mlk is decomposed along dotted lines formed as the above extended lines meet each other. In addition, the second outer edge Eo2 adjacent to the upper corner C2 and the fourth outer edge Eo4 adjacent to the lower corner C3 are selected.

Next, a line of the second outer edge Eo2 is extended to the left into the layout Mlk, a line of the fourth outer edge Eo4 is extended upwards into the layout Mlk, and the layout Mlk is decomposed along dotted lines that are formed as the above extended lines meet each other. By decomposing the layout Mlk as described above, four inner edges (first through fourth Ein1 through Ein4) may be formed.

In FIG. 8A, the layout Mlk having a single shape without separate portions is illustrated. Accordingly, two inner edges connecting the second outer edge Eo2 and the fourth outer edge Eo4 are denoted by one first edge dotted line Ein1/2. Also, two inner edges connecting the first outer edge Eo1 and the third outer edge Eo3 is denoted by one second edge dotted line Ein3/4.

As illustrated in FIG. 8B, the four, inner edges Ein1 through Ein4 may be more distinct when separated portions Mlk1 through Mlk3 of the layout Mlk are separated. For example, the layout Mlk may be decomposed into a first layout Mlk1, a second layout Mlk2, and a third layout Mlk3 through decomposition of the layout Mlk. Accordingly, a first inner edge Ein1 (which is a dotted line) is formed in the first layout Mlk1. The second inner edge Ein2 (which is a dotted line) and the third inner edge Ein3 (which is an alternated long and short dashed line) may be formed in the second layout Mlk2. The fourth inner edge Ein4 (which is an alternated long and short dashed line) may be formed in the third layout Mlk3.

However, the first through third layouts Mlk1 through Mlk3 decomposed through the decomposition of the layout Mlk may not be immediately separated, but may be maintained in a combined structure at first as illustrated in FIG. 8A. Subsequently, the first through third layouts Mlk1 through Mlk3 may be displaced through repeated MRC and OPC simulation such that inner fragments respectively corresponding to the first through fourth inner edges Ein1 through Ein4 are separated from each other.

Figure 9A:
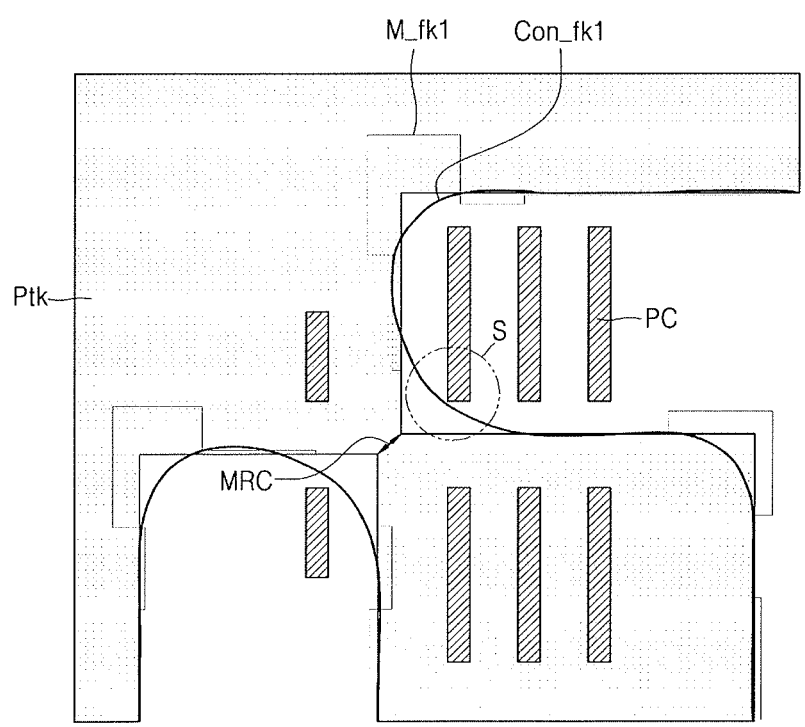
FIGS. 9A and 9B illustrate one proposed mask and a contour of a target pattern including a kissing pattern finally obtained using an OPC method and an embodiment for using an OPC method.
Figure 9B:
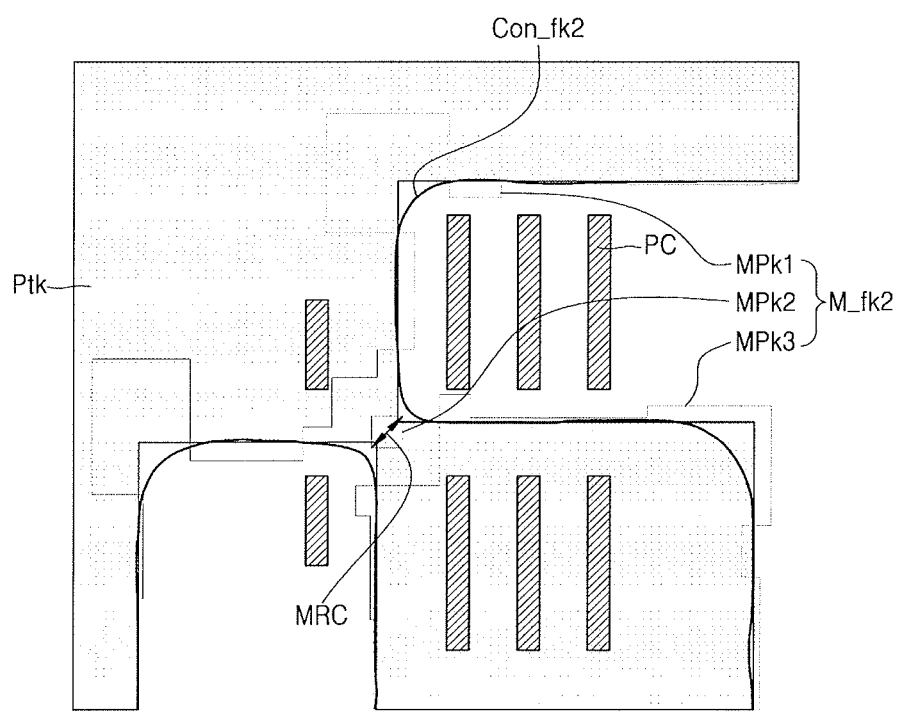

FIGS. 9A and 9B illustrate conceptual diagrams of a mask and a contour of a target pattern including a kissing pattern finally obtained using an OPC method according to a proposed approach and using an OPC method according to one embodiment, respectively. Here, thin lines may correspond to final layouts M_fk1 and M_fk2 and thick curves may correspond to final contours Con_fk1 and Con_fk2.

Referring to FIG. 9A illustrating the final layout M_fk1 and the contour Con_fk1 of the mask obtained using the OPC method without layout decomposition method, the layout M_fk1 of the mask is not reduced enough due to the MRC restrictions, as marked by a two-way arrow in a kissing area where vertex portions of two squares overlap each other. Thus, CRR may increase greatly.

In particular, if the length of an edge of a layout adjacent to an area around the kissing area is short, as an edge of a layout is not sufficiently divided into a sufficient number of fragments, corner distortion may increase even more. As a result, as denoted by a circle S marked by a dotted line, it is difficult to provide sufficient space between the final contour Con_fk1 and gate lines PC, which, in turn, may lead to a reduction in process margin. Here, the target pattern Ptk may be a pattern covering some of the gate lines PC and leaving the others exposed.

Referring to FIG. 9B illustrating the final layout M_fk2 and the contour Con_fk2 of a mask obtained using the OPC method according to the present embodiment, in which a layout decomposition method is used, as a degree of freedom of an inner edge generated through layout decomposition is added, MRC restrictions may be avoided and an excellent CRR may be obtained at the same time. For example, in a mask obtained using the OPC method according to FIG. 9A, CRR in a kissing pattern is 100 nm, whereas in a mask obtained using the OPC method according to the present embodiment, a CRR of the kissing pattern may be about 33 nm, which is a reduction of about one third. Accordingly, space between the contour Con_fk2 and the gate lines PC is increased, thereby obtaining a sufficient process margin.

Further, as may be seen in FIG. 9B, the final layout M_fk2 includes three separate layouts MPk1, MPk2, and MPk3, e.g., spaced apart from one another, while allowing the MRC restriction to be met. In contrast, the final layout M_fk1 of FIG. 9A and the original layout of the pattern Ptk forms a single, continuous layout in which all portions of the layout are adjoined.

It is described above that the OPC method of the present embodiment may be applied to improve corner rounding in a pattern having a corner. However, the OPC method according to the present embodiment may be used not only for patterns having a corner, but may be applied to patterns of other various shapes. For example, if a layout is decomposed for a particular purpose regardless of the presence of a corner, the OPC method according to the present embodiment may be applied to inner edges generated through layout decomposition.

While the same edges are used both in OPC simulation and calculation of errors according to the proposed approach, different edges may be used in OPC simulation and in calculation of errors according to the OPC method of the present embodiment. For example, referring to FIG. 3A, in the OPC method of the proposed approach, a first outer edge Eo1 and a second outer edge Eo2 are used in OPC simulation, and in calculation of errors such as calculation of a CRR or an EPE. On the other hand, in the OPC method of the present embodiment, the first through fourth inner edges Ein1 through Ein4 may be mapped on outer edges to be used in OPC simulation, and only the first and second outer edges Eo1 and Eo2 are used in calculation of a CRR or an EPE or the like. Thus, edges used in OPC simulation and edges used in error calculation may be different.

Also, according to the OPC method of the present embodiment, a weight may be applied to a particular fragment by modifying a radius of a circle (Halo) and the weight factor (R) used in selecting a selected fragment. In addition, by appropriately adjusting a radius of the circle (Halo) and the weight factor (R), the OPC method may be flexibly applied based on an importance of a pattern.

Figure 10:
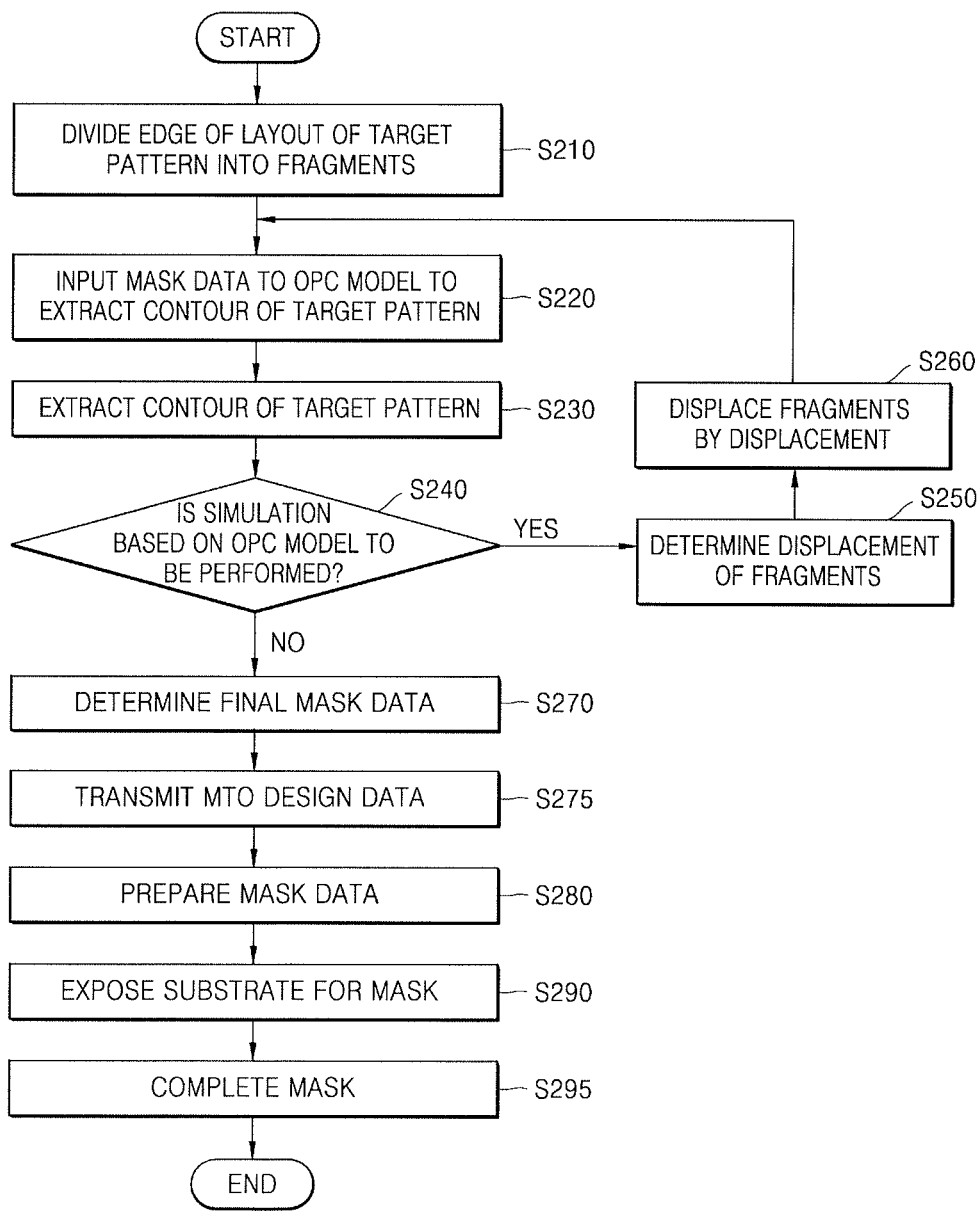
FIG. 10 illustrates an embodiment of a method for manufacturing a mask.

FIG. 10 illustrates an embodiment of a method for manufacturing a mask. Referring to FIG. 10, first, an OPC method is performed. The OPC method may include dividing an edge of a layout into fragments (S210), extracting a contour of a target pattern (S220), calculating an EPE of each fragment (S230), determining whether to perform simulation based on an OPC model (S240), and determining final mask data (S270). Also, the OPC method may selectively include determining a displacement of a fragment (S250) and displacing a fragment by the displacement (S260). Operations S210 through S270 of the OPC method according to the method of manufacturing a mask of the present embodiment are as described about operations S110 through S170 of the OPC method of FIG. 1.

After performing the OPC method, mask tape-out (MTO) design data is transmitted (S275). MTO may indicate transferring final mask data, on which OPC is completed, to a mask manufacturing team to request to manufacture of a mask. Accordingly, MTO design data may ultimately correspond to final mask data on which an OPC method is performed. The MTO design data may have a graphics data format used, for example, in Electronic Design Automation (EDA) software. For example, the MTO design data may have a data format such as a Graphic Data System II (GDS2), Open Artwork System Interchange Standard (OASIS) or the like.

After transmitting the MTO design data, mask data preparation (MDP) is performed (S280). The MDP may include, for example, format conversion referred to as fracturing, augmentation of a bar code for mechanical reading, a standard mask pattern for inspection, or a job deck, and automatic or manual verification. The job deck may refer to creating a text file about a series of instructions such as arrangement information of multiple mask files, standard dose, an exposure speed or an exposure method.

Meanwhile, format conversion (e.g., fracturing) may refer to a process of dividing MTO design data into respective regions and converting a format of the MTO design data to a format for an electronic beam exposure device. The fracturing may include data manipulation, e.g., scaling, sizing of data, data rotating, pattern reflection, color conversion, and the like. During a conversion process via fracturing, data corresponding to numerous systematic errors that may occur at any point during a transferring process from design data to an image on a wafer may be corrected. The data correction process on the systematic errors may be referred to as mask process correction (MPC). The MPC may include, e.g., line width adjustment, i.e., critical dimension (CD) adjustment and an operation of increasing pattern arrangement precision. Thus, fracturing may contribute to an improvement in the quality of a final mask and may be performed in advance. The systematic errors may be caused due to distortion generated during, e.g., an exposure process, a mask development and etching process, a wafer imaging process, and the like.

MDP may include MPC. MPC may be an operation for correcting errors caused during an exposure operation, e.g., systematic errors as described above. The exposure operation may include electronic beam writing, development, etching, baking, or the like. In addition, data processing may be performed prior to an exposure operation. Data processing is a type of pre-processing operation and, for example, may include a grammar check, exposure time prediction, or the like, on mask data.

After performing the MDP, a substrate for a mask is exposed based on the mask data (S290). Exposure may indicate, for example, electronic beam writing. The electronic beam writing may be performed using, for example, a gray writing method in which a multi-beam mask writer (MBMW) is used. In addition, the electronic beam writing may also be performed using a variable shape beam (VSB) exposure apparatus.

After the MDP, an operation for converting the mask data to pixel data may be performed prior to an exposure operation. The pixel data may include data that is directly used in exposure and may include, e.g., data indicative of a shape which is an exposure object and data indicative of a dose allocated to the data corresponding to the shape. The data corresponding to the shape may be, for example, bit-map data that is obtained by converting shape data, e.g., vector data, via rasterization, or the like.

After the exposure operation, a series of operations are performed to complete the mask (S295). The series of operations may include, e.g., development, etching, washing, and the like. In addition, the series of operations for mask manufacturing may include measuring, defect inspection, or defect repair. In addition, a pellicle coating operation may also be included. The pellicle coating operation may refer to an operation of attaching pellicles to the mask to protect a surface of the mask from subsequent contamination during a delivery period of the mask or an allowed lifetime of the mask once the mask is confirmed to be without contaminant particles or chemical stains through final washing and inspection.

According to the mask manufacturing method of the present embodiment, an inner edge is generated through layout decomposition, and a displacement DISin_frag of an inner fragment and a displacement DISsel of a selected fragment are calculated based on the inner edge to additionally displace fragments to thereby implement a mask layout with minimum corner rounding without violating the MRC. Moreover, by manufacturing a mask through an exposure operation based on the mask layout above, an excellent mask that allows forming of an optimum target pattern on a wafer may be manufactured.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An optical proximity correction (OPC) method, comprising:
    dividing an edge of a layout of a target pattern into fragments;
    extracting a contour of the target pattern through simulation by inputting mask data including the fragments to an OPC model;
    calculating a difference between the contour and an edge of the target pattern as an edge placement error (EPE) of each of the fragments;
    determining whether to perform extracting a contour of the target pattern;
    when extracting the contour of the target pattern is to be performed, determining a displacement of the fragments by multiplying the EPE by a set feedback factor;
    displacing the fragments by the displacement, wherein the OPC method proceeds to extracting the contour of the target pattern using displaced fragments,
    wherein, dividing the edge of the layout of the target pattern into fragments includes decomposing the layout of the target pattern to form an inner edge, and the edge of the layout includes an outer edge before decomposing the layout and the inner edge, and the fragments include an outer fragment for the outer edge and an inner fragment for the inner edge;
    determining final mask data when the EPE is equal to or less than a set reference value or a number of times of performing simulation according to the OPC model equals a set reference number of times; and
    outputting the final mask data to be used to make a mask.

2. The OPC method as claimed in claim 1, wherein, calculating the EPE of each fragment includes calculating an edge placement error (EPE) (EPEout_frag) for the outer fragment based on a difference between the contour for the outer fragment and the edge of the target pattern, and
    calculating an EPE (EPEin_frag) relating to the inner fragment based on Formula (1) below:

EPEin_frag=1/n*ΣEPEsel(i)    Formula (1), wherein, when a circle having a set radius is drawn with respect to the inner fragment, and the outer fragment having at least a portion included within the circle is referred to as a selected fragment, n (natural number) indicates the number of selected fragments, and EPEsel (i) (i is a natural number from 1 to n) is an EPE about the i-th selected fragment.

3. The OPC method as claimed in claim 2, wherein, in determining of the displacement of the fragment, a displacement (DISin_frag) of the inner fragment is calculated based on Formula (2) below:

DISin_frag=EPEin_frag*FB*R    Formula (2), wherein a displacement (DISsel) of the selected fragment is calculated based on Formula (3) below:

DISsel=EPEsel*FB*(1−R)    Formula (3), wherein FB denotes the feedback factor, and R denotes a set weight factor having a value equal to or greater than 0 and equal to or less than 1.

4. The OPC method as claimed in claim 3, wherein the DISin_frag and the DISsel are controlled by adjusting the set weight factor R.

5. The OPC method as claimed in claim 3, wherein, when a distance between a location of a corner and a point adjacent to the corner, where the contour meets the edge of the target pattern, is defined as a corner rounding radius (CRR), the CRR is controlled by adjusting the set radius of the circle and the set weight factor R.

6. The OPC method as claimed in claim 1, wherein decomposing the layout is performed along a line that extends from a line of the outer edge into the layout at a corner of the target pattern and meets a line of another outer edge or along two lines that extend from a line of the outer edge into the layout and from a line of another outer edge into the layout at the corner and meet each other.

7. The OPC method as claimed in claim 1, wherein,
    extracting the contour of the target pattern includes using the mask data including the fragments displaced by mask rule check (MRC) in a simulation based on a first OPC model,
    generating the inner edge on both sides of the decomposed layout, and
    displacing the inner fragment by the MRC on both sides of the decomposed layout.

8. The OPC method as claimed in claim 1, wherein determining whether to perform the extracting a contour of the target pattern includes:
    when the EPE is equal to or greater than the set reference value or when the number of times of performing simulation according to the OPC model does not equal the set reference number of times, determining to perform extracting the contour of the target pattern, and
    when the EPE is less than the set reference value or when the number of times of performing simulation according to the OPC model equals the set reference number of times, determining to perform extracting the contour of the target pattern.

9. The OPC method as claimed in claim 8, wherein, when extracting the contour of the target pattern is not performed, not performing determining the displacement of the fragment and displacing the fragment by the displacement, and proceeding to determining the mask data as final mask data.

10. The OPC method as claimed in claim 9, wherein the final mask data includes data of at least two layouts separated from each other as that were adjoined in the layout of the target pattern.

11. An optical proximity correction (OPC) method, comprising:
    decomposing a layout of a target pattern including a corner;
    dividing an inner edge of the layout obtained by decomposing and an outer edge of the layout prior to decomposing, into fragments;

extracting a contour of the target pattern through simulation by inputting mask data including the fragments, to an OPC model;

calculating a difference between the contour and an edge of the target pattern as an edge placement error (EPE) of each of the fragments;

determining a displacement of the fragments by multiplying the EPE by a set feedback factor; and displacing the fragments by the displacement, wherein extracting the contour of the target pattern includes using the mask data including the fragments displaced by mask rule check (MRC) in a simulation based on a first OPC model, and wherein, when the EPE is greater than a set reference value or a number of times of performing simulation according to the OPC model does not equal a set reference number of times, proceeding to extracting the contour of the target pattern using displaced fragments, and when the EPE is equal to or less than the set reference value or the number of times of performing simulation according to the OPC model equals the set reference number of times, outputting mask data as final mask data to be used to make a mask.

12. The OPC method as claimed in 11, wherein:
the fragments include an outer fragment relating to the outer edge and an inner fragment relating to the inner edge, and
calculating the EPE of each of the fragments includes
calculating an EPE (EPEout_frag) for the outer fragment based on a difference between the contour for the outer fragment and the edge of the target pattern, and
calculating an EPE (EPEin_frag) for the inner fragment by calculating an average EPE (EEPsel) of selected fragments that are the outer fragments having at least a portion included within a circle having a set radius with respect to the inner fragment.

13. The OPC method as claimed in claim 12, wherein determining the displacement of the fragments includes:
calculating a displacement (DISin_frag) of the inner fragment by multiplying the EPEin_frag, the feedback factor, and a set weight factor, and
calculating a displacement (DISsel) of the selected fragments by multiplying the EPEsel, the feedback factor, and a value obtained by subtracting the weight factor from 1,
wherein the weight factor has a value equal to or greater than 0 and equal to or less than 1.

14. The OPC method as claimed in claim 13, wherein:
the weight factor is adjusted to control the DISin_frag and the DISsel, and
when a distance from a location of the corner to a point adjacent to the corner and where the contour meets the edge of the target pattern is defined as a corner rounding radius (CRR), the CRR is controlled by adjusting the set radius of the circle and the weight factor.

15. The OPC method as claimed in claim 11, wherein:
the final mask data includes data of at least two layouts that are separated from each other relative to the layout of the target pattern.

16. A mask manufacturing method, comprising:
decomposing a layout of a target pattern including a corner;
dividing an inner edge of the layout obtained by decomposing and an outer edge of the layout, prior to decomposing, into fragments;

extracting a contour of the target pattern through simulation by inputting mask data including the fragments to an optical proximity correction (OPC) model;

calculating a difference between the contour and an edge of the target pattern for each of the fragments as an edge placement error (EPE);

determining whether the EPE is equal to or less than a set reference value, or a number of times of performing simulation according to the OPC model equals a set reference number of times;

determining final mask data when the EPE is equal to or less than a set reference value or the number of times of performing simulation according to the OPC model equals the set reference number of times;

transferring the final mask data as mask tape-out (MTO) design data;

preparing mask data based on the MTO design data; and performing exposure on a substrate for a mask, based on the mask data, wherein, when the EPE is greater than the reference value or the number of times of performing simulation according to the OPC model does not equal the reference number of times, the OPC method further includes:

determining a displacement of the fragments by multiplying the EPE by a set feedback factor; and displacing the fragment by the displacement, and proceeding to extracting the contour of the target pattern based on displaced fragments.

17. The mask manufacturing method as claimed in claim 16, wherein calculating the EPE of each of the fragments includes:
calculating an edge placement error (EPE) (EPEout_frag) for an outer fragment based on a difference between the contour for the outer fragment and an edge of the target pattern, and
calculating an EPE (EPEin_frag) for an inner fragment is calculated based on Formula (1) below:

$$EPEin\_frag = 1/n * \Sigma EPEsel(i) \quad \text{Formula (1)},$$

wherein a selected fragment is an outer fragment having at least a portion included within a circle having a set radius with respect to the inner fragment, n (natural number) indicates a number of selected fragments, and the EPEsel(i) (i is a natural number from 1 to n) is an EPE for an i-th selected fragment.

18. The mask manufacturing method as claimed in claim 17, wherein:
determining a displacement of the fragment, a displacement (DISin_frag) of the inner fragment is calculated based on Formula (2) below:

$$DISin\_frag = EPEin\_frag * FB * R \quad \text{Formula (2)},$$

calculating a displacement (DISsel) of the selected fragment based on Formula (3) below:

$$DISsel = EPEsel * FB * (1-R) \quad \text{Formula (3)},$$

where FB is the feedback factor and the R is a set weight factor having a value equal to or higher than 0 and equal to or less than 1.

19. The mask manufacturing method as claimed in claim 18, further comprising controlling the DISin_frag and the DISsel by adjusting the set weight factor R, and
when a distance from a location of the corner to a point adjacent to the corner and where the contour meets the edge of the target pattern is defined as a corner rounding radius (CRR), the CRR is controlled by adjusting the set radius of the circle and the set weight factor R.

20. The mask manufacturing method as claimed in claim 16, wherein:
   determining the mask data as final mask data, and
   the final mask data includes data of at least two layouts separated from each relative to the layout of the target pattern.

* * * * *